(12) United States Patent
Fujita et al.

(10) Patent No.: US 10,692,860 B2
(45) Date of Patent: Jun. 23, 2020

(54) POWER MODULE AND POWER CONVERTER

(71) Applicant: HITACHI, LTD., Chiyoda-ku, Tokyo (JP)

(72) Inventors: Ryuusei Fujita, Tokyo (JP); Kumiko Konishi, Tokyo (JP); Akio Shima, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 16/217,398

(22) Filed: Dec. 12, 2018

(65) Prior Publication Data

US 2019/0198495 A1 Jun. 27, 2019

(30) Foreign Application Priority Data

Dec. 26, 2017 (JP) .................. 2017-248696

(51) Int. Cl.
| | |
|---|---|
| *H01L 27/06* | (2006.01) |
| *H03K 17/12* | (2006.01) |
| *H01L 27/02* | (2006.01) |
| *H01L 29/423* | (2006.01) |
| *H03K 17/082* | (2006.01) |
| *H03K 17/16* | (2006.01) |

(52) U.S. Cl.
CPC ...... *H01L 27/0629* (2013.01); *H01L 27/0207* (2013.01); *H01L 29/42312* (2013.01); *H03K 17/0822* (2013.01); *H03K 17/122* (2013.01); *H03K 17/163* (2013.01)

(58) Field of Classification Search
CPC ..................................................... H01L 23/495
See application file for complete search history.

(56) References Cited

U.S. PATENT DOCUMENTS

| | | | |
|---|---|---|---|
| 2011/0102054 A1* | 5/2011 | Domes | H01L 24/49 327/419 |
| 2013/0134958 A1* | 5/2013 | Mochikawa | H01H 47/00 323/311 |

FOREIGN PATENT DOCUMENTS

JP  11-235015 A  8/1999

* cited by examiner

*Primary Examiner* — Jae Lee
(74) *Attorney, Agent, or Firm* — Miles & Stockbridge, P.C.

(57) ABSTRACT

An object of the present invention is to increase the reliability of a power module and a power converter and to extend their life. In order to achieve this, a power module includes: two switching devices each including a diode and a transistor, the two switching devices being electrically connected in parallel; and an insulating substrate on which the two switching devices are mounted. Further, a gate electrode of MOFET that each of the two switching device has is electrically connected to a gate resistance. Further, of the two switching devices, the gate resistance that is electrically connected to the switching device, whose current value is smaller when a predetermined voltage is applied in the forward direction of the body diode, is greater than the gate resistance that is electrically connected to the switching device whose current value is larger.

5 Claims, 10 Drawing Sheets

POWER MODULE AND POWER CONVERTER

BACKGROUND

The present invention relates to a power module and power converter having a plurality of semiconductor chips including a built-in diode.

For example, power semiconductor chips are widely used for power converters such as inverter and convertor, or for power modules such as power control devices. Then, with increasing power capacity or other causes leading to an increase in the heat generated by semiconductor chips, the power module is required to have high reliability even in a high temperature environment.

In the power converter and the power control device, when a plurality of semiconductor chips are connected in parallel, the current balance of the semiconductor chips is an important factor in achieving high reliability.

Note that with respect to a voltage-driven power semiconductor device, for example, Japanese Unexamined Patent Application Publication No. Hei 11 (1999)-235015 (Patent Literature 1) discloses a method for storing in advance a gate current value that achieves the most balanced distribution of current so as to improve the current balance in each element, and controlling each gate current control circuit based on the stored data.

SUMMARY

In recent years, the development of semiconductor such as SiC capable of high temperature operation has been promoted. In SiC, a stacking fault may grow by the energy generated when current is applied to a PN junction. In such a case, the electric resistance of the drift layer increases and the device characteristics are degraded. Then, in the power module or other device in which a plurality of semiconductor chips are electrically connected in parallel, when the characteristics of any one of the semiconductor chips are degraded, the current is concentrated in the other semiconductor chips and heat generation increases, and thus there is a possibility that the semiconductor chips will be destroyed.

An object of the present invention is to provide a technique that can increase the reliability of a power module and a power converter, and can extend their life.

The above and other objects and novel features of the present invention will become apparent from the description and drawings of the following specification.

The typical ones of the inventions disclosed in the present application will be briefly described as follows.

A power module according to an embodiment, includes: a plurality of semiconductor chips each including a built-in diode and a transistor that are electrically connected to each other, the semiconductor chips being electrically connected in parallel; and a substrate on which the semiconductor chips are mounted. A gate electrode of the transistor that each of the semiconductor chips has is electrically connected to a gate resistance. Further, in any two of the semiconductor chips, the gate resistance that is electrically connected to a semiconductor chip whose current value is smaller when a predetermined voltage is applied in the forward direction of the diode, is greater than the gate resistance that is electrically connected to a semiconductor chip whose current value is larger when the predetermined voltage is applied in the forward direction of the diode.

Further, a power module according to an embodiment, includes: first and second semiconductor chips each including a built-in diode and a transistor that are electrically connected to each other, the first and second semiconductor chips being electrically connected in parallel; and a substrate on which the first and second semiconductor chips are mounted. A gate electrode of the transistor that each of the first and second semiconductor chips has is electrically connected to a gate resistance. Further, of the first and second semiconductor chips, the gate resistance electrically connected to a semiconductor chip whose current value is smaller when a predetermined voltage is applied in the forward direction of the diode, is greater than the gate resistance that is electrically connected to a semiconductor chip whose current value is larger when the predetermined voltage is applied in the forward direction of the diode.

Further, a power converter according to an embodiment includes a first wiring, and a second wiring with an electrical potential lower than the first wiring. Further, the power converter also includes: a high-side transistor unit located between the first wiring and the second wiring, the high-side transistor unit being electrically connected to the first and second wirings; and a low-side transistor unit located between the first wiring and the second wiring, the low-side transistor unit being electrically connected to the first and second wirings and being electrically connected in series to the high-side transistor unit. Further, a plurality of transistors are electrically connected in parallel to each of the high-side transistor unit and the low-side transistor unit. Each of the transistors is electrically connected to the diode, and the gate electrode of each of the transistors is electrically connected to the gate resistance. Further, in each of the high-side transistor unit and the low-side transistor unit, the gate resistance that is electrically connected to a transistor whose current value is smaller when a predetermined voltage is applied in the forward direction of the diode, is greater than the gate resistance that is electrically connected to a transistor whose current value is larger when the predetermined voltage is applied in the forward direction of the diode.

The effect obtained by typical ones of the inventions disclosed in the present application will be briefly described as follows.

It is possible to increase the reliability of a power module and a power converter and to extend their life.

DETAILED DESCRIPTION

First Embodiment

Figure 1:
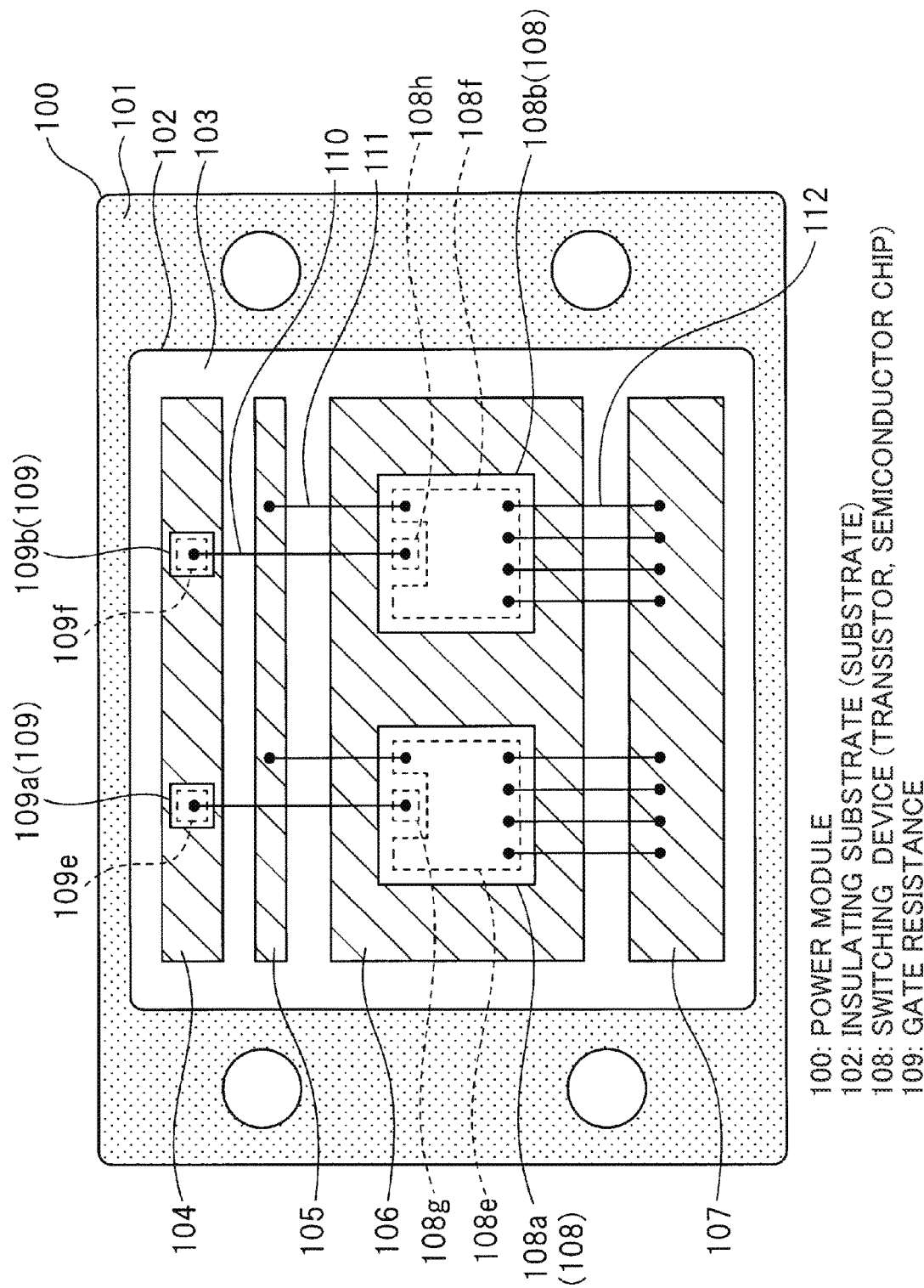
FIG. 1 is a plan view showing an example of the structure of a power module according to a first embodiment of the present invention.
Figure 2:
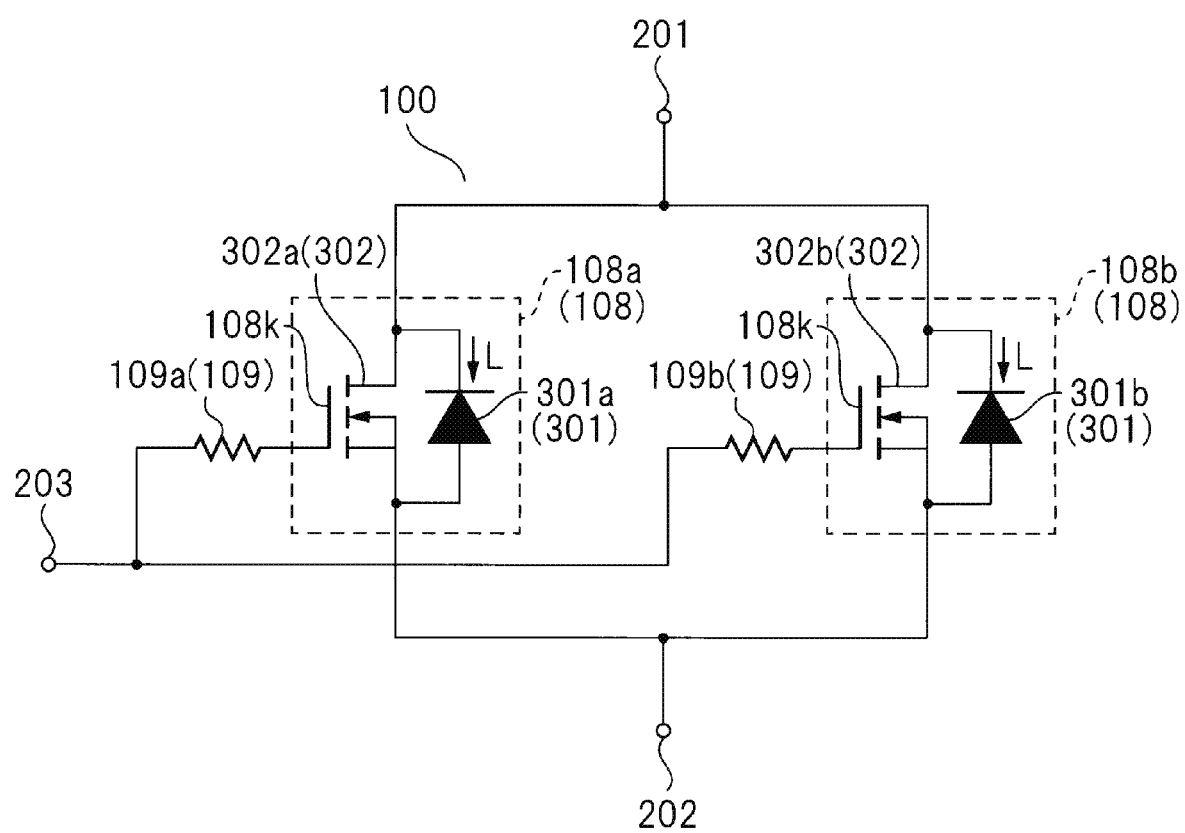
FIG. 2 is a circuit diagram of the power module shown in FIG. 1.

FIG. 1 is a plan view showing an example of the structure of a power module according to a first embodiment of the present invention, and FIG. 2 is a circuit diagram of the power module shown in FIG. 1.

First, the structure of a power module 100 according to the first embodiment is described with reference to FIGS. 1 and 2.

The power module 100 of the first embodiment shown in FIG. 1 is configured with a plurality of semiconductor chips (hereinafter, also simply referred to as chips) mounted on a substrate. The following description will be given assuming that each of the semiconductor chips is a switching device. Here, the case of mounting two semiconductor chips on a substrate is described as an example. Then, in the power module 100, the two semiconductor chips are electrically connected in parallel.

Further, the power module 100 has a metallic heat radiation base 101 and an insulating substrate (substrate) 102 is provided on the heat radiation base 101. Then, the insulating substrate is provided with various wiring patterns (hatched part in FIG. 1) over the surface through an insulating layer 103. In other words, various wiring patterns are provided on the insulating layer 103 formed on the surface of the insulating substrate 102, in such a way that the wiring patterns are isolated (separated) from each other.

In the case of the power module 100 shown in FIG. 1, for example, conductive patterns such as a gate wiring pattern 104, a source sense wiring pattern 105, a drain wiring pattern 106, and a source wiring pattern 107 are formed separately from each other on the insulating layer 103.

Then, a first switching device (first semiconductor chip) 108a and a second switching device (second semiconductor chip) 108b are provided on the drain wiring pattern 106, respectively, through a conductive bonding material (for example, such as solder). In order to maintain the current capacity, the first switching device 108a and the second switching device 108b are electrically connected in parallel as shown in FIG. 2, and are mounted on the drain wiring pattern 106.

Further, in the first embodiment, the description assumes that the first switching device 108a and the second switching device 108b are each comprised of silicon carbide (SiC).

Note that the first switching device 108a has a source pad 108e and a gate pad 108g on the surface side. Also, the second switching device 108b has a source pad 108f and a gate pad 108h on the surface side.

Then, the source pad 108e of the first switching device 108a and the source wiring pattern 107 of the insulating substrate 102 are electrically connected by a plurality of source wires 112 which are conductive wires. Further, the source pad 108e of the first switching device 108a and the source sense wiring pattern 105 of the insulating substrate 102 are electrically connected by a source sense wire 111 which is a conductive wire.

Further, the gate pad 108g of the first switching device 108a and the gate wiring pattern 104 of the insulating substrate 102 are electrically connected by a gate wire 110 which is a conductive wire. At this time, in the power module 100 according to the first embodiment, a first gate resistance 109a, which is a chip resistance, is mounted on the gate wiring pattern 104. Then, the gate wire 110 and the gate wiring pattern 104 are electrically connected through the first gate resistance 109a. In other words, the gate wire 110 is electrically connected to the gate resistance pad 109e that the first gate resistance 109a has.

On the other hand, the source pad 108f of the second switching device 108b and the source wiring pattern 107 of the insulating substrate 102 are electrically connected by a plurality of source wires 112. Further, the source pad 108f of the second switching device 108b and the source sense wiring pattern 105 of the insulating substrate 102 are electrically connected by the source sense wire 111.

Further, the gate pad 108h of the second switching device 108b and the gate wiring pattern 104 of the insulating substrate 102 are electrically connected by the gate wire 110. At this time, in the power module 100, similar to the first switching device 108a, a second gate resistance 109b, which is a chip resistance, is mounted on the gate pattern 104. Then, the gate wire 110 and the gate wiring pattern 104 are electrically connected through the second gate resistance 109b. In other words, the gate wire 110 on the side of the second switching device 108b is electrically connected to the gate resistance pad 109f that the second gate resistance 109b has.

In the power module 100 according to the first embodiment, as shown in FIG. 2, each semiconductor chip is a power system MOSFET (Metal Oxide Semiconductor Field Effect Transistor, hereinafter also referred to as a power MOS) 302. A body diode, which is a diode, is built in each switching device. In other words, each switching device is configured with a power MOS and a body diode. Note that body diode is also referred to as built-in diode.

More specifically, the first semiconductor chip is a first MOSFET (power MOS) 302a and is applied as the first switching device 108a. Then, a body diode 301a is built in the first switching device 108a. Further, the first switching device 108a is electrically connected to the first gate resistance 109a on the outside of the first switching device 108a. Note that in the first embodiment, the first gate resistance 109a is the chip resistance mounted on the gate wiring pattern 104.

On the other hand, as shown in FIG. 2, the second semiconductor chip is a second MOSFET (power MOS) 302b and is applied as the second switching device 108b. Then, a second built-in body diode 301b is built in the second switching device 108b. Further, the second switching device 108b is electrically connected to the second gate resistance 109b on the outside of the second switching device 108b. Note that, similar to the first gate resistance 109a, the second gate resistance 109b is the chip resistance mounted on the gate wiring pattern 104 of the insulating substrate 102 shown in FIG. 1.

Here, as shown in FIG. 2, in each of the first switching device 108a and the second switching device 108b, each of the first body diode 301a and the second body diode 301b is electrically connected in the direction opposite to the forward direction L of the circuit.

Further, the drain electrode of each of the first switching device 108a and the second switching device 108b is electrically connected to a drain terminal 201 of the power module 100.

Further, the source electrode of each of the first switching device 108a and the second switching device 108b is electrically connected to a source terminal 202 of the power module 100.

Further, a gate electrode 108k of the first switching device 108a is electrically connected to a gate terminal 203 of the power module 100 through the first gate resistance 109a. Similarly, a gate electrode 108k of the second switching device 108b is also electrically connected to the gate terminal 203 of the power module 100 through the second gate resistance 109b.

Here, in order to reduce current variation in each chip during the use of the body diode (built-in diode), the power module 100 according to the first embodiment is designed to select semiconductor chips with similar voltage characteristics in the forward direction L in the stage of chip screening in the manufacturing of the power module 100.

However, it is difficult to select chips with exactly the same characteristics. Thus, in the power module 100 according to the first embodiment, the gate resistance that is electrically connected to a switching device whose current value is smaller when a predetermined voltage is applied in the forward direction L of the body diode, is set to be greater than the gate resistance that is electrically connected to a switching device whose current value is greater when the predetermined voltage is applied in the forward direction L of the diode. More specifically, the gate resistance connected to a switching device whose current value is smaller when a predetermined voltage in the forward direction L of the body diode, is set to be greater than the gate resistance connected to a switching device whose current value is greater when the predetermined voltage is applied in the forward direction L of the diode. In other words, in the stage of chip screening, semiconductor chips with similar voltage characteristics in the forward direction L are selected and mounted. Then, in the assembly of the power module 100, chip resistances which become gate resistances, each of which has a different resistance value, are mounted on the insulating substrate 102. In this way, the gate resistance that is electrically connected to a switching device whose current value is smaller when a predetermine voltage is applied in the forward direction L of the body diode, is set to be greater than the gate resistance that is electrically connected to a switching device whose current value is larger when the predetermined voltage is applied in the forward direction L of the diode.

For example, when the current value when a predetermined voltage is applied in the forward direction L of the body diode 301 is larger in the first switching device 108a than in the second switching device 108b, the current distribution of the second switching device 108b increases during back flow.

Then, the temperature is higher in the second switching device 108b in which the current distribution increases. The body diode 301 has a characteristic that the higher the temperature the more the current is likely to flow, so that the balance of current flowing through each element is degraded.

Thus, in the power module 100 according to the first embodiment, when the current value when a predetermined voltage is applied in the forward direction L of the body diode 301 is smaller in the first switching device 108a than in the second switching device 108b, the gate resistance (chip resistance) greater than the gate resistance of the second switching device 108b is connected to the first switching device 108a to increase the switching loss. In this way, it is possible to increase the current distribution of the first switching device 108a and to reduce the difference in the heat generation and temperature between the semiconductor chips.

Note that the magnitude of the current value when a predetermined voltage is applied in the forward direction L of the body diode (built-in diode) is based on the comparison of the specific characteristics of each of the body diodes.

As an example, under the same temperature and humidity conditions, when the current value when a predetermined voltage is applied in the forward direction L of the body diode is smaller in the first switching device 108a than in the second switching device 108b, a resistance (for example, a chip resistance) whose resistance value is greater than that of the second gate resistance 109b is used for the first gate resistance 109a.

As described above, in the power module 100 according to the first embodiment, of the parallel-connected switching devices (semiconductor chips), by increasing the gate resistance connected to a switching device whose current value is greater when a predetermine voltage is applied in the forward direction L of the body diode, it is possible to increase the switching loss of the switching device whose current value is smaller. In this way, the temperature of the switching device with the smaller current value increases, so that the voltage in the forward direction L can be reduced.

As a result, it is possible to prevent current concentration in other switching devices (semiconductor chips), and to improve the current balance (current distribution) in each element.

Thus, it is possible to prevent destruction of semiconductor chips caused by heat generation or other factors and to increase the reliability of the power module 100. At the same time, it is possible to extend the life of the power module 100.

Note that by using the chip resistance as the gate resistance, the assembly of the power module 100 can be facilitated by using a plurality of chip resistances with different resistance values, even after chip screening and chip mounting in the assembly of the power module 100.

Figure 3:
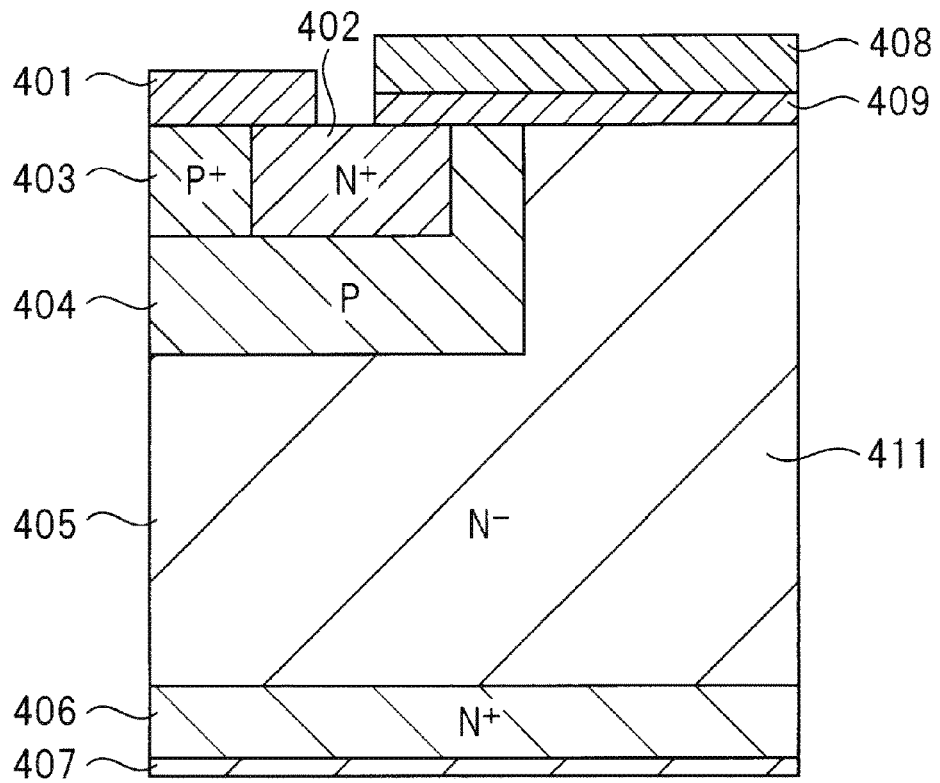
FIG. 3 is a cross-sectional view showing an example of the structure of the main part of a semiconductor chip mounted in the power module shown in FIG. 1.
Figure 4:
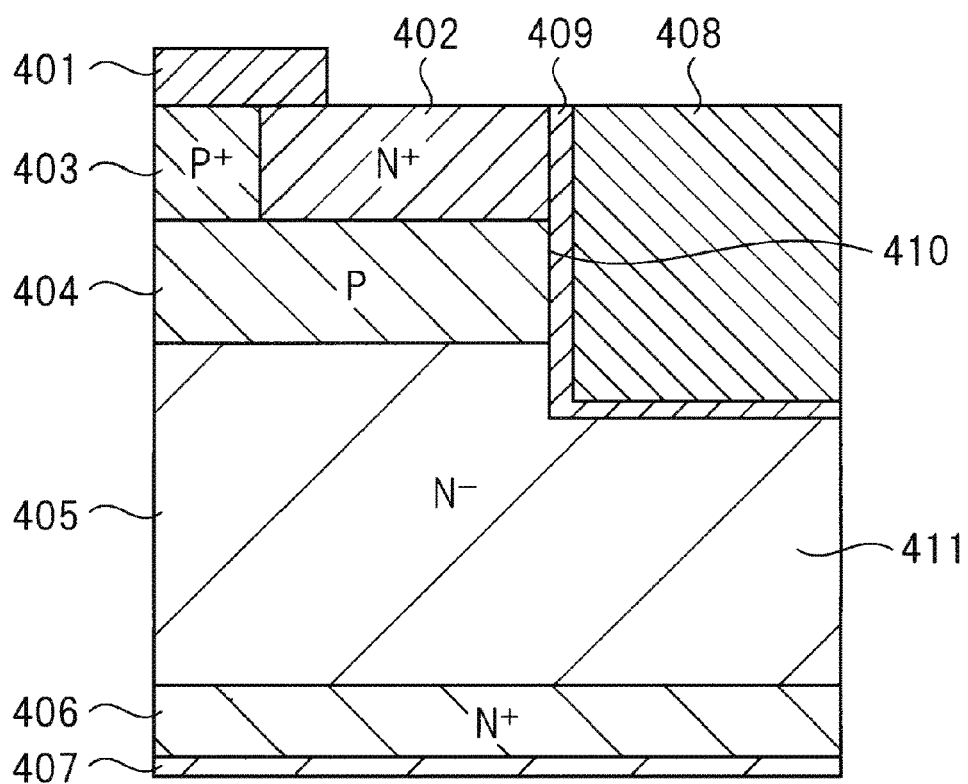
FIG. 4 is a cross-sectional view showing a variation of the structure of the main part of the semiconductor chip mounted in the power module shown in FIG. 1.

Next, MOSFET (power MOS) shown in FIGS. 3 and 4 is described as an example of applying the power MOS to the switching device. FIG. 3 is a cross-sectional view showing an example of the structure of the main part of a semiconductor chip mounted in the power module shown in FIG. 1. FIG. 4 is a cross-sectional view showing a variation of the structure of the main part of the semiconductor chip mounted in the power module shown in FIG. 1.

The MOSFET shown in FIG. 3 is DMOSFET (Double-diffusion Metal Oxide Semiconductor Field Effect Transistor). DMOSFET has an $N^+$ substrate 406 in the bottom part, and an $N^-$ layer 405 is formed in the upper layer. Further, a P body layer 404 is formed in the upper layer of the $N^-$ layer 405. Further, a $P^+$ layer 403 and an $N^+$ layer 402 are formed above the P body layer 404 so that the $P^+$ layer 403 and the $N^+$ layer 402 are embedded in the P body layer 404.

Further, on the main surface including the $N^+$ layer 402 and the $P^+$ layer 403, a source electrode 401 is formed so as to be electrically connected to the $N^+$ layer 402 and the $P^+$ layer 403. Further, a gate electrode 408 is formed on the main surface through a gate insulating film 409. The gate electrode 408 is arranged so as to at least overlap the P body layer 404 in a plan view. On the other hand, a drain electrode 407 is formed on the back surface.

Further, the MOSFET shown in FIG. 4 is a trench MOSFET. Similar to DMOSFET, the trench MOSFET includes an $N^+$ substrate 406 in the bottom part, and the $N^-$ layer 405 is formed in the upper layer of the $N^+$ substrate 406. Further, the P body layer 404 is formed above the $N^-$ layer 405. Further, the $P^+$ layer 403 and the $N^+$ layer 402 are formed above the P body layer 404. Then, on the main surface including the $N^+$ layer 402 and the $P^+$ layer 403, the source electrode 401 is formed so as to be electrically connected to the $N^+$ layer 402 and the $P^+$ layer 403.

Further, a groove 410 is formed so as to reach the $N^-$ layer 405 from the main surface including the $N^+$ layer 402 and the $P^+$ layer 403, passing through the $N^+$ layer 402 and the P body layer 404. The gate electrode 408 is formed in the groove 410 through the gate insulating film 409. On the other hand, similar to DMOSFET, the drain electrode 407 is formed on the back surface.

Then, each of DMOSFET shown in FIG. 3 and trench MOSFET shown in FIG. 4 includes a diode in which the source electrode 401 serves as anode and the drain electrode 407 serves as cathode. Note that the $N^-$ layer 405 is also an epitaxial layer 411. In other words, each of DMOSFET and trench MOSFET is also power MOS including the epitaxial layer 411.

Thus, when the power module is DMOSFET shown in FIG. 3 and trench MOSFET shown in FIG. 4, and when the power module includes the semiconductor chip of SiC with the built-in power MOS including the epitaxial layer 411, a stacking fault may grow in the epitaxial layer 411 by the energy generated when applying current to the PN junction.

Figure 5:
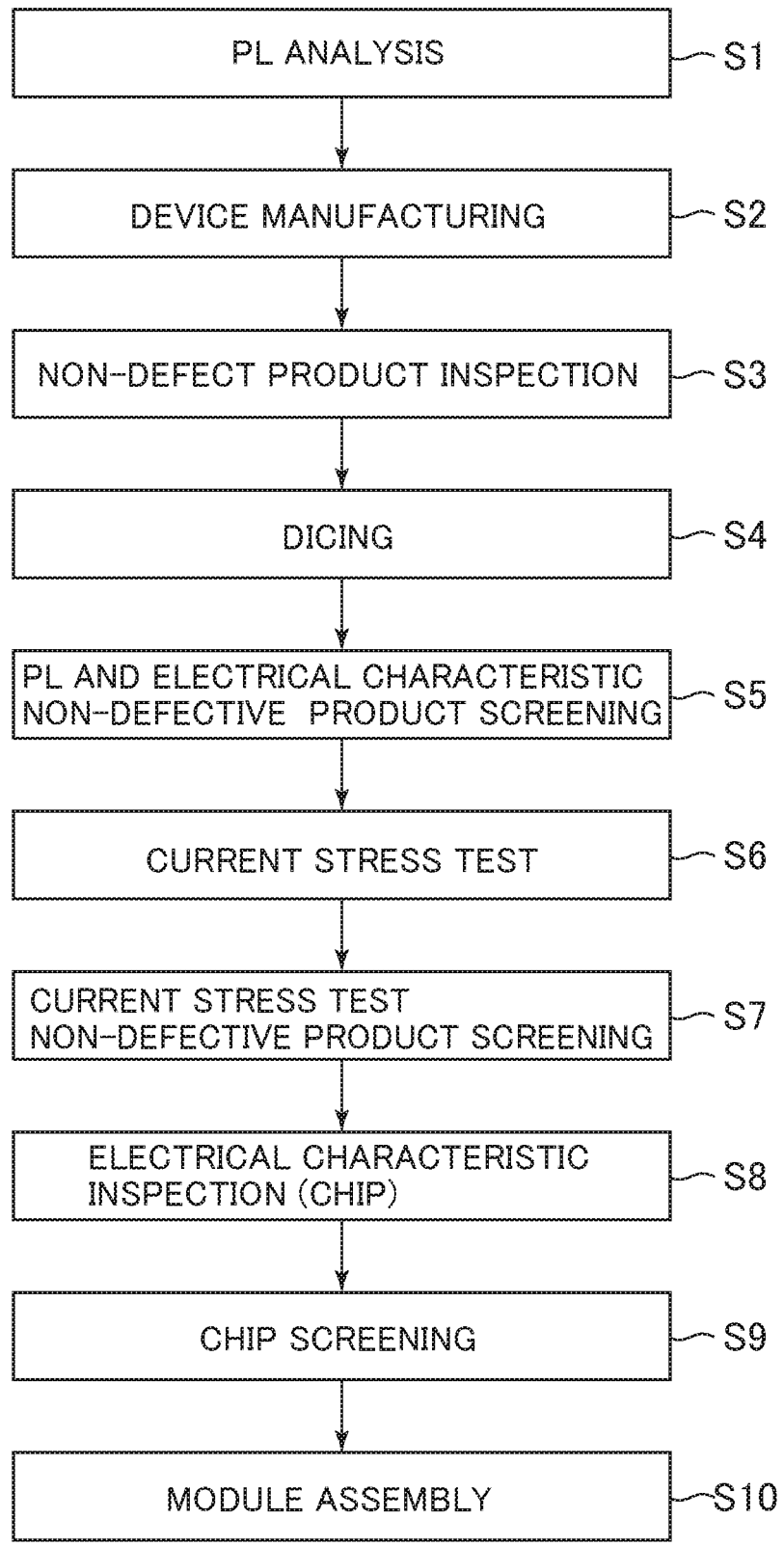
FIG. 5 is a process flow diagram showing an example of the manufacturing procedure of the power module according to the first embodiment of the present invention.
Figure 6:
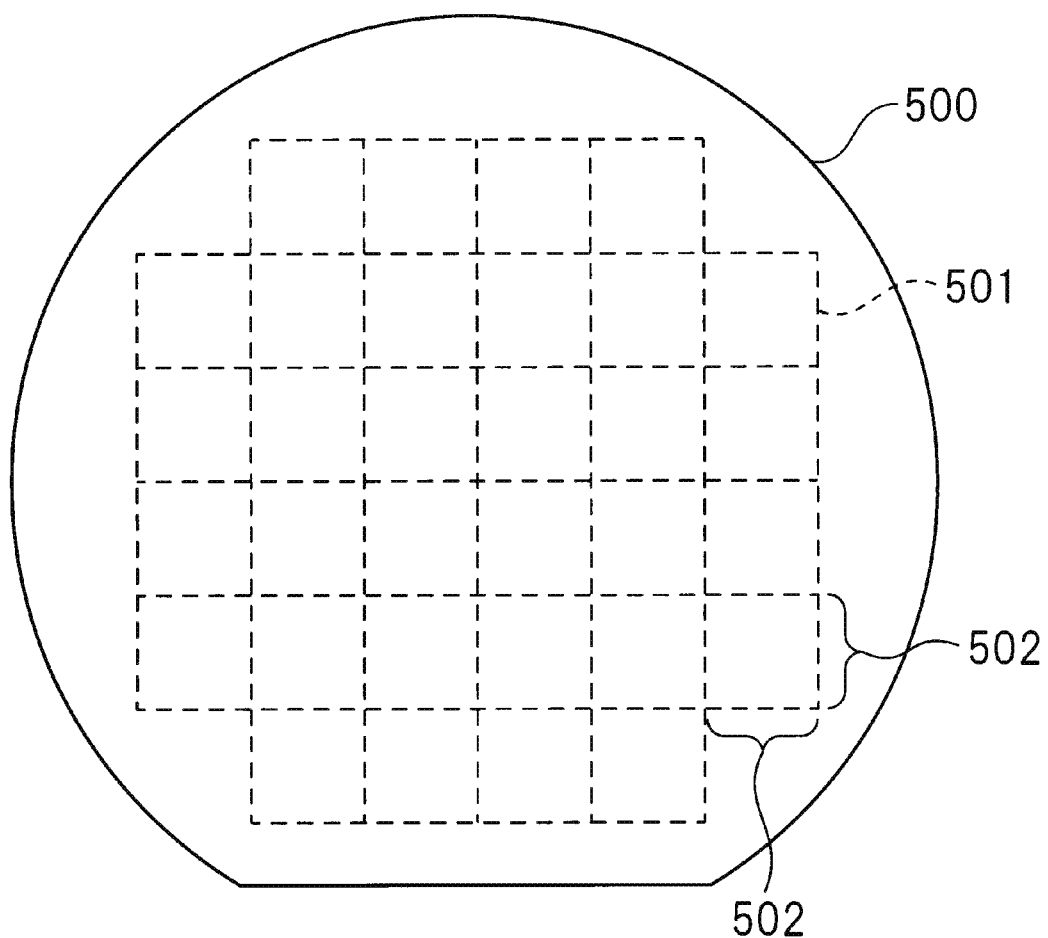
FIG. 6 is a schematic diagram showing an example of PL analysis results (whole wafer) in the manufacturing procedure shown in FIG. 5.
Figure 7:
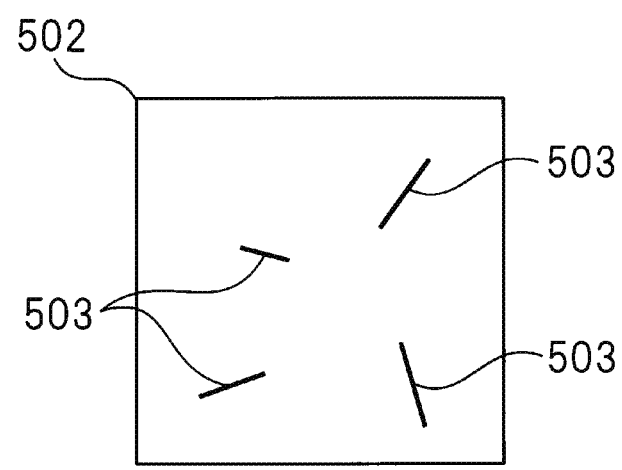
FIG. 7 is a schematic diagram showing an example of PL analysis results (chip region) in the manufacturing procedure shown in FIG. 5.

The next describes the manufacturing method of the power module according to the first embodiment. FIG. 5 is a process flow diagram showing an example of the manufacturing procedure of the power module according to the first embodiment of the present invention. FIG. 6 is a schematic diagram showing an example of PL analysis results (whole wafer) in the manufacturing procedure shown in FIG. 5. FIG. 7 is a schematic diagram showing an example of PL analysis results (chip region) in the manufacturing procedure shown in FIG. 5.

The manufacturing method of the power module 100 is described by using the flow shown in FIG. 5. First, PL (Photo Luminescence) analysis of Step S1 shown in FIG. 5 is performed. The PL analysis is a technique to determine crystal defects by irradiating an object with light. The PL analysis first generates a PL mapping of the whole wafer in a semiconductor wafer 500 shown in FIG. 6. Note that in FIG. 6, dashed lines are scribe lines 501 as the mark for dicing, and the area surrounded by dashed lines is one chip region 502. The PL analysis counts the number of basal plane dislocations (BPD) 503 shown in FIG. 7 that are present in each chip region 502. As a result, when a predetermined number or more of basal plane dislocations 503 are found in a semiconductor chip, it is determined that the semiconductor chip is defective.

After that, the semiconductor wafer 500 is cut along the scribe lines 501, and then only non-defective chips proceed to the next process. Note that because the plane coordinates of the basal plane dislocation 503 can be located on the semiconductor wafer 500, it is possible to determine the presence or absence of the basal plane dislocation 503 in each chip region by combining the coordinates of the scribe lines 501.

Note that FIG. 7 shows the results of the PL analysis of one chip region 502 as an example, in which the basal plane dislocation 503 (BPD) is observed as a linear form.

Further, the PL analysis observes the basal plane dislocations 503 within the $N^-$-type epitaxial layer. In the case in which the basal plane dislocation 503 is present within the $N^-$-type epitaxial layer, the basal plane dislocation 503 grows to form a stacking fault by the recombination energy when applying current to the PN junction when the current returns to the built-in diode. The stacking fault functions as an electrical resistance and the drift resistance of the $N^-$ layer 405 (epitaxial layer 411) shown in FIGS. 3 and 4 increases. Thus, when a switching device including the basal plane dislocation 503 is used, characteristic deterioration occurs in the switching device and in the built-in diode. The degree of the characteristic deterioration depends on the number and positions of the basal plane dislocations 503 within the semiconductor chip. For this reason, the characteristic deterioration is different in each chip.

Thus, the characteristic deterioration by the stacking fault growth causes current variation among chips. The basal plane dislocations 503, which are the cause of the stacking fault growth, are observed by the PL analysis, and for example, only semiconductor chips not including the basal plane dislocations 503 are used in the power module 100. In this way, it is possible to prevent the characteristic deterioration during the operation of the power module 100, and to prevent the current variation associated with the characteristic deterioration.

In the flow shown in FIG. 5, Step S2 shows MOSFET manufacturing, which is device manufacturing, after the PL analysis. However, the PL analysis can also be performed during the manufacturing process of MOSFET as long as the PL analysis is performed before electrode formation.

After the PL analysis, device manufacturing shown in Step S2 is performed. In the device manufacturing, the MOSFET shown in FIGS. 3 and 4 is manufactured.

After the device manufacturing, non-detective product inspection shown in Step S3 is performed. This non-defective product inspection is a fully automatic inspection that is performed on all the semiconductor chips (chip regions 502) in the state of the semiconductor wafer 500, regardless of the results of the PL analysis. The non-defective product inspection includes the contents such as subthreshold characteristics of MOSFET, transfer characteristics, output characteristics, leakage current, dielectric strength, forward direction voltage of the body diode, and gate insulating film reliability.

After the non-defective product inspection, dicing shown in Step S4 is performed. In the dicing, the semiconductor wafer 500 is cut along the scribe lines 501 shown in FIG. 6 to divide the semiconductor wafer 500 into individual semiconductor chips.

After the dicing, PL and electrical characteristic non-defective product screening shown in Step S5 is performed. In the PL and electrical characteristic non-defective product screening, semiconductor chips in which leakage currents or other defects are found, as well as semiconductor chips with a large number of basal plane dislocations are not transmitted to current stress test, which is the next step, but are screened out in this step.

After the PL and electrical characteristic non-defective product screening, the current stress test shown in Step S6 is performed. The current stress test applies current stress to the semiconductor chip determined to be non-defective in the PL and electrical characteristic non-defective product screening.

After the current stress test, current stress test non-defective product screening shown in Step S7 is performed. In the current stress test non-defective product screening, the semiconductor chips are screened out when determined that the deterioration level exceeds a predetermined threshold in the current stress test. In other words, the current stress test compares the characteristics between before and after current stress. For example, the percentage of the ratio between before deterioration and after deterioration is set in advance as a threshold to determine NG. Then, in the case of semiconductor chips determined as NG based on the ratio between before deterioration and after deterioration, these semiconductor chips are screened out.

After the current stress test non-defective product screening, electrical characteristic inspection (chip) shown in Step S8 is performed. In the electrical characteristic inspection, the electrical characteristic inspection of semiconductor chip is performed again. In other words, the electrical characteristics are measured again because a characteristic change within a tolerance may occur even if the semiconductor chip passed the current stress test.

After the electrical characteristic inspection (chip) is performed, chip screening shown in Step S9 is performed. The chip screening performs screening in such away that the semiconductor chip with the smaller current value when a predetermined voltage is applied in the forward direction L shown in FIG. 2 accordingly has a large gate resistance after assembly. For example, the screening first refers to the results of the electrical characteristic inspection (chip) of Step S8, and selects semiconductor chips with similar characteristics such as body diodes. In other words, the chip screening determines one pair of semiconductor chips to be mounted on the power module 100 (or determines a combination of mounted semiconductor chips).

After the chip screening, module assembly shown in Step S10 is performed. In other words, the assembly of the power module 100 shown in FIG. 1 is performed. In this assembly process, for example, the power module 100 according to the first embodiment implements the first gate resistance 109a and the second gate resistance 109b, which are chip resistances, on the gate wiring pattern 104 of the insulating substrate 102, and adjusts the magnitude of the gate resistance that is electrically connected to each semiconductor chip.

In this way, in the power module 100, of the first switching device 108a (first semiconductor chip) and the second switching device 108b (second semiconductor chip) which are connected in parallel, it is designed to increase the gate resistance connected to the switching device (semiconductor chip) with the smaller current value when a predetermined voltage is applied in the forward direction L of the body diode.

In the assembly of the power module 100, the first switching device 108a and the second switching device 108b are mounted on the drain wiring pattern 106 of the insulating substrate 102. At the same time, the first gate resistance 109a and the second gate resistance 109b, which are chip resistances, are mounted on the gate wiring pattern 104.

After each chip is mounted, each of the first switching device 108a and the second switching device 108b is electrically connected to a given wiring pattern of the insulating substrate 102 by a given wire. Further, the first switching device 108a and the first gate resistance 109a are electrically connected by a given wire. At the same time, the second switching device 108b and the second gate resistance 109b are electrically connected by a given wire.

After the wire bonding, a desired process such as resin sealing is performed to complete the assembly of the power module 100.

Figure 8:
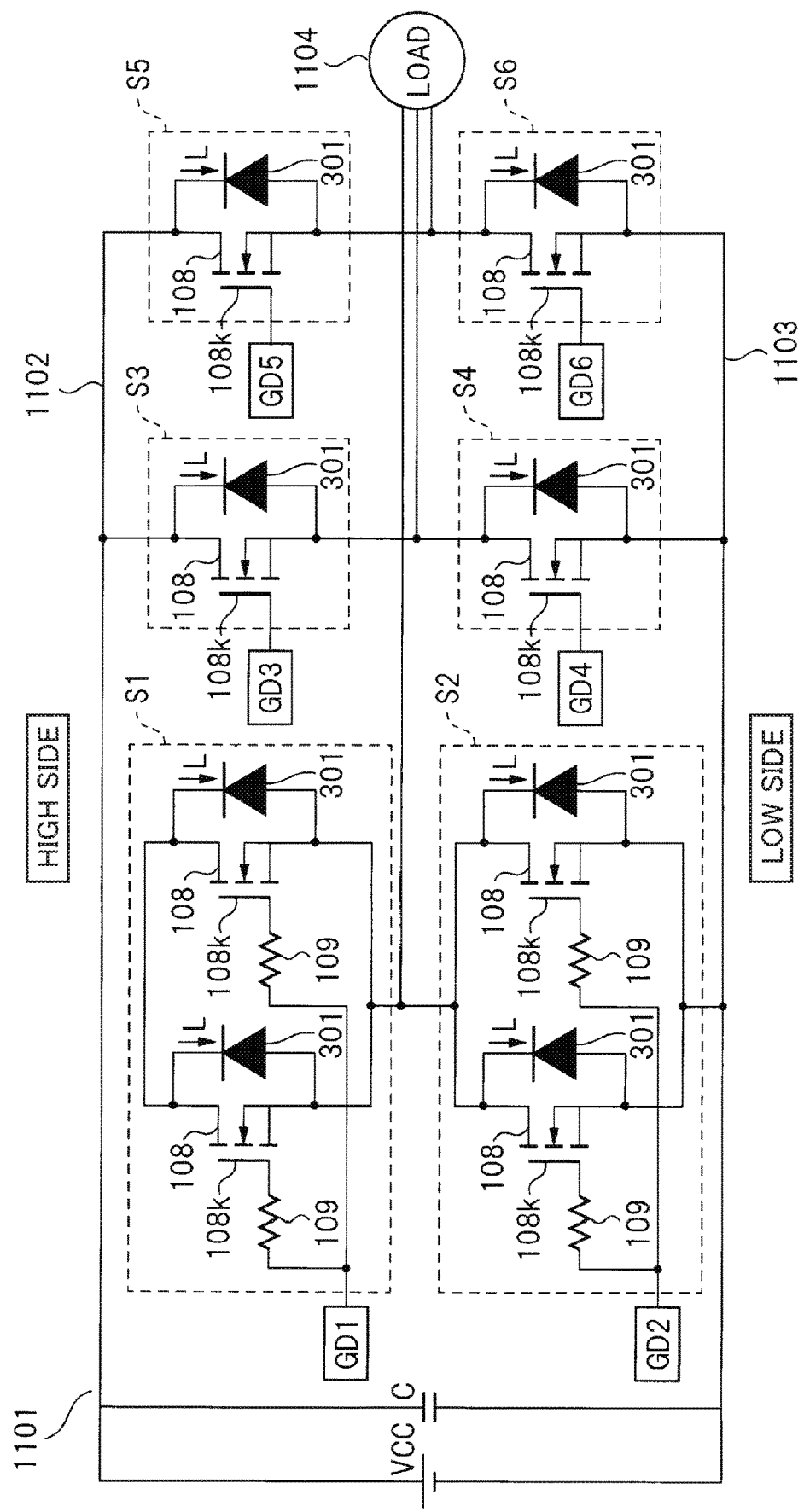
FIG. 8 is a circuit diagram of a power converter which is the power module according to the first embodiment of the present invention.

The next describes a power converter which is an example of the power module of the first embodiment. FIG. 8 is a circuit diagram of a power converter which is the power module of the first embodiment.

A power converter 1101 shown in FIG. 8 is an inverter and has a plurality of switching device groups S1 to S6. Each of the switching device groups S1 to S6 is a MOSFET group configured with a plurality of switching devices (transistors) 108 and a plurality of gate resistances 109. Each switching device 108 is built in the semiconductor chip of SiC. Note that one switching device is shown as a representative of the switching device groups S3 to S6 to make the figure easy to understand.

Further, series-connected two switching device groups (for example, S1 and S2) are not tuned on at the same time. In other words, when the switching device group S1 is turned off, the switching device group S2 is turned on after a fixed time, called dead time, has elapsed. Then, during the dead time, the current flows through the body diode (built-in diode) 301 of the switching device group S1 or the switching device group S2 depending on the direction of the load current. This also applies to the switching device groups S3 and S4 and to the switching device groups S5 and S6.

The configuration of the power converter 1101 is described here in detail. The power converter 1101 includes a high-side (high-potential side) line (first line) 1102, as well as a low-side (low-potential side) line 1103 in which the potential is lower than the line 1102. Further, the power converter 1101 includes switching device groups S1, S3, and S5 which are high-side transistor units provided between the line 1102 and the line 1103. The switching device groups S1, S3, and S5 are electrically connected to the line 1102 and the line 1103. Further, the power converter 1101 includes switching device groups S2, S4, and S6 which are low-side transistor units provided between the line 1102 an the line 1103. The switching device groups S2, S4, and S6 are electrically connected to the line 1102 and the line 1103, and at the same time, are electrically connected in series to the switching device groups S1, S3, and S5, respectively.

More specifically, the switching device group S1, which is electrically connected to the line 1102, and the switching device group S2, which is electrically connected to the line 1103, are electrically connected in series between the line 1102 and the line 1103. Further, the switching device group S3, which is electrically connected to the line 1102, and the switching device group S4, which is electrically connected to the line 1103, are electrically connected in series between the line 1102 and the line 1103. Further, the switching device group S5, which is electrically connected to the line 1102, and the switching device group S6, which is electrically connected to the line 1103, are electrically connected in series between the line 1102 and the line 1103.

Note that each of the power supply voltage VCC and the capacitor C is electrically connected between the line 1102 and the line 1103. Further, each of the switching device groups S1, S2, S3, S4, S5, and S6 is electrically connected to a load (LOAD) 1104. The load 1104 is, for example, a three-phase AC motor.

Further, each of the gate resistances 109 of the switching device group S1 is electrically connected to a gate drive circuit GD1. Similarly, each of the gate resistances 109 of the switching device group S2 is electrically connected to a gate drive circuit GD2, and each of the gate resistances 109 of the switching device group S3 is electrically connected to a gate drive circuit GD3. Further, each of the gate resistances 109 of the switching device group S4 is electrically connected to a gate drive circuit GD4, and each of the gate resistances 109 of the switching device group S5 is electrically connected to a gate drive circuit GD5. Then, each of the gate resistances 109 of the switching device group S6 is electrically connected to a gate drive circuit GD6.

Note that the switching devices (transistors) 108 are electrically connected in parallel in the switching device groups S1, S3, S5, which are high-side transistor units, and in the switching device groups S2, S4, S6, which are low-side transistor units. Further, each of the switching devices 108 is electrically connected to the body diode (built-in diode) 301. Further, the gate electrode 108k of each of the switching devices 108 is electrically connected to the gate resistance 109.

Then, the power converter 1101 is configured such that, in each of the switching device groups S1, S2, S3, S4, S5, and S6, the resistance value is greater in the gate resistance 109 electrically connected to the switching device 108 with the smaller current value when a predetermined voltage is applied in the forward direction L of the body diode 301, than in the gate resistance 109 electrically connected to the switching device 108 with the larger current value when the predetermined voltage is applied in the forward direction L of the body diode 301.

With this configuration, also in the power converter 1101 according to the first embodiment, it is possible to increase the switching loss of the switching device 108 with the smaller current value in each switching device group. In this way, the temperature of the switching device 108 with the smaller current value increases, so that the current distribution can be increased. As a result, it is possible to prevent current concentration in other switching devices 108, and to improve the current balance in each element. In this way, it is possible to increase the reliability of the power converter 1101, and to extend the life of the power converter 1101.

Second Embodiment

Figure 9:
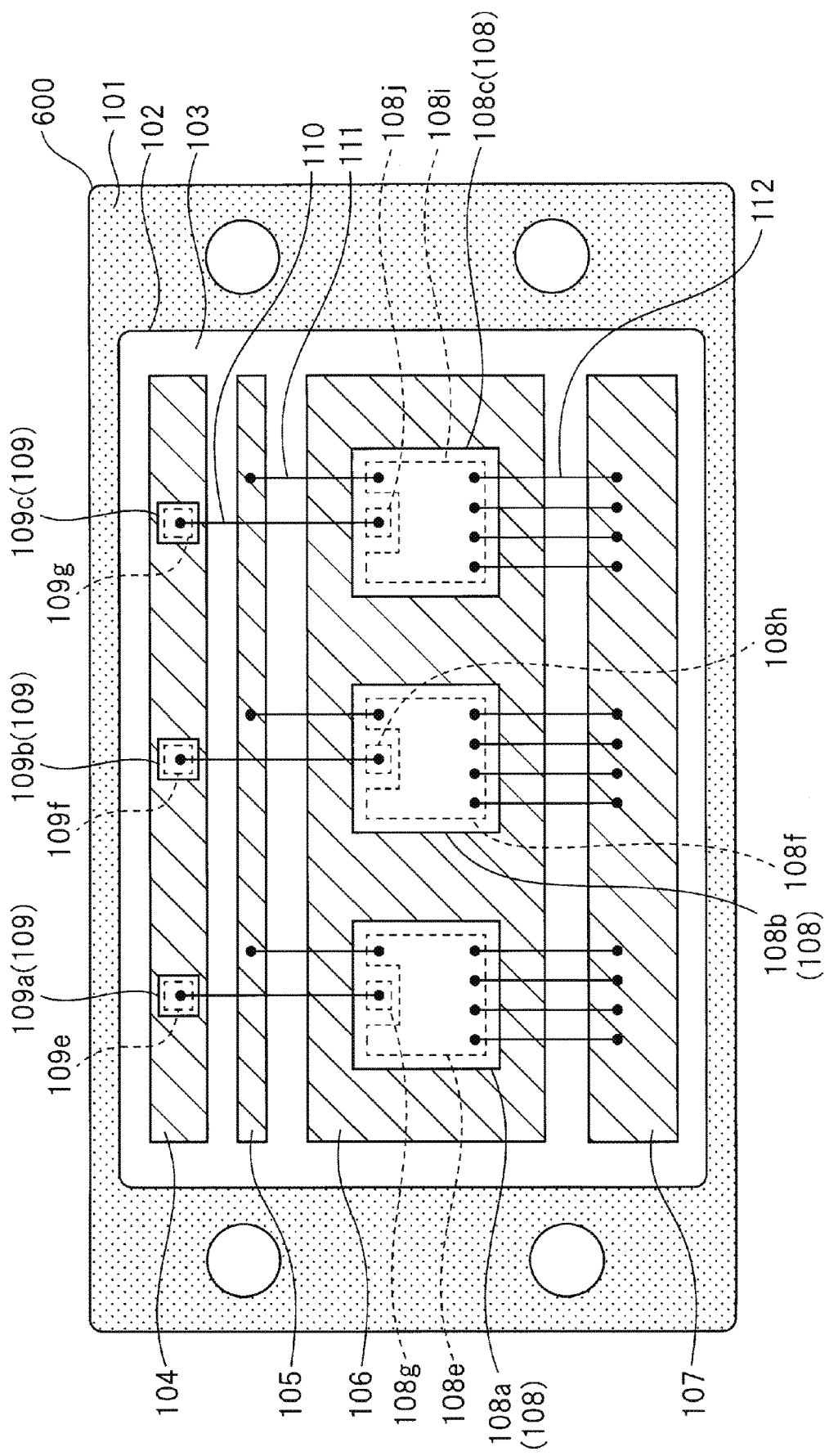
FIG. 9 is a plan view showing an example of the structure of a power module according to a second embodiment of the present invention.
Figure 10:
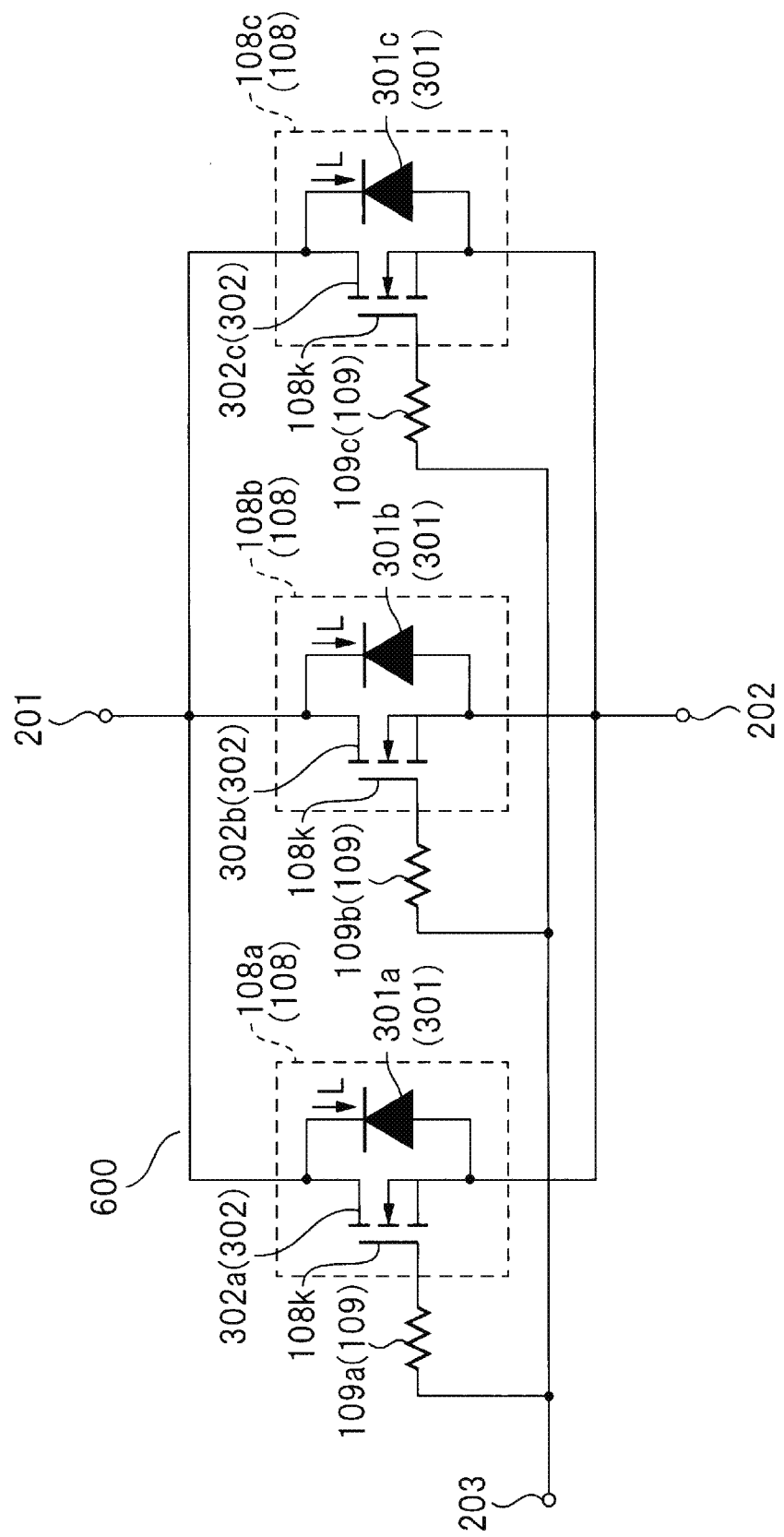
FIG. 10 is a circuit diagram of the power module shown in FIG. 9.

FIG. 9 is a plan view showing an example of the structure of a power module according to a second embodiment of the present invention. FIG. 10 is a circuit diagram of the power module shown in FIG. 9.

A power module 600 according to the second embodiment shown in FIG. 9 is configured in such away that three or more switching devices are electrically connected in parallel. The second embodiment describes a case in which three switching devices are mounted on the power module 600. As shown in FIG. 10, three switching devices are a first switching device (first semiconductor chip) 108a, a second switching device (second semiconductor chip) 108b, and a third switching device (third semiconductor chip) 108c. The three switching devices 108 are electrically connected in parallel in order to maintain the current capacity.

In other words, also in the power module 600, the third semiconductor chip is a third MOSFET (power MOS) 302c, which is applied as the third switching device 108c. Then, a third body diode (diode) 301c is built in the third switching device 108c.

Further, also in the power module 600, each of the first switching device 108a, the second switching device 108b, and the third switching device 108c is comprised of silicon carbide (SiC).

Note that the power module 600 is the same as the power module 100 of the first embodiment with respect to the structure of the insulating substrate 102, the implementation structure of the first switching device 108a and the second switching device 108b, and the structure of the wire connection among the wiring patterns (hatched part in FIG. 9) of the insulating substrate 102 of each switching device. Thus, their descriptions will be omitted.

Here, the third switching device 108c has a source pad 108i and a gate pad 108j on the surface side. Then, the source pad 108i of the third switching device 108c and the source wiring pattern 107 of the insulating substrate 102 are electrically connected by a plurality of source wires 112 which are conductive wires. Further, the source pad 108i of the third switching device 108c and the source sense wiring pattern 105 of the insulating substrate 102 are electrically connected by the source sense wire 111 which is a conductive wire.

Further, the gate pad 108j of the third switching device 108c and the gate wiring pattern 104 of the insulating substrate 102 are electrically connected by the gate wire 110 which is a conductive wire. At this time, also in the power module 600, a third gate resistance 109c, which is a chip resistance, is mounted on the gate wiring pattern 104. The gate wire 110 and the gate wiring pattern 104 are electrically connected through the third gate resistance 109c. In other words, the gate wire 110 is electrically connected to a gate resistance pad 109g that the third gate resistance 109c has.

Further, as shown in FIG. 10, the third body diode (diode) 301c is built in the third switching device 108c. Further, the third switching device 108c is electrically connected to the third gate resistance 109c on the outside of the third switching device 108c. Also in the second embodiment, the third gate resistance 109c is a chip resistance mounted on the gate wiring pattern 104 of the insulating substrate 102 shown in FIG. 11.

Further, as shown in FIG. 10, the third body diode 301c built in the third switching device 108c is electrically connected in the direction opposite to the forward direction L of the circuit.

Note that, also in the power module 600, the drain electrode of each of the first switching device 108a, the second switching device 108b, and the third switching device 108c is electrically connected to the drain terminal 201 of the power module 600.

Further, the source electrode of each of the first switching device 108a, the second switching device 108b, and the third switching device 108cc is electrically connected to the source terminal 202 of the power module 600.

Further, the gate electrode 108k of the third switching device 108c is electrically connected to the gate terminal 203 of the power module 600 through the third gate resistance 109c, similar to the gate electrode 108k of the first switching device 108a as well as the gate electrode 108k of the second switching device 108b.

Also in the second embodiment, when comparing two of the parallel-connected three switching devices, the resistance value is greater in the gate resistance connected to the semiconductor chip with the smaller current value when a predetermined voltage is applied to the forward direction L of the body diode 301, than in the gate resistance connected to the semiconductor chip with the larger current value when the predetermined voltage is applied in the forward direction L.

For example, in the power module 600, it is assumed that the current value when the predetermined voltage is applied in the forward direction L of the first body diode 301a built in the first switching device 108a is smaller than the current value when the predetermined voltage is applied in the forward direction L of the second body diode 301b built in the second switching device 108b. In this case, the chip resistance with the resistance value greater than the second gate resistance 109b is used for the first gate resistance 109a.

Further, it is assumed that the current value when a predetermined voltage is applied in the forward direction L of the second body diode 301b built in the second switching device 108b is smaller than the current value when the predetermined voltage is applied in the forward direction L of the third body diode 301c built in the third switching device 108c. In this case, the chip resistance with the resistance value greater than the third gate resistance 109c is used for the second gate resistance 109b.

In this way, also in the power module 600 according to the second embodiment, in any two of the three semiconductor chips, it is possible to increase the switching loss of the semiconductor chip whose current value is smaller. In this way, the temperature of the semiconductor chip with the smaller current value increases and so the current distribution can be increased. As a result, it is possible to prevent current concentration in other semiconductor chips, and to improve the current balance (current distribution) in each chip. In this way, it is possible to increase the reliability of the power module 600, and to extend the life of the power module 600.

Third Embodiment

Figure 11:
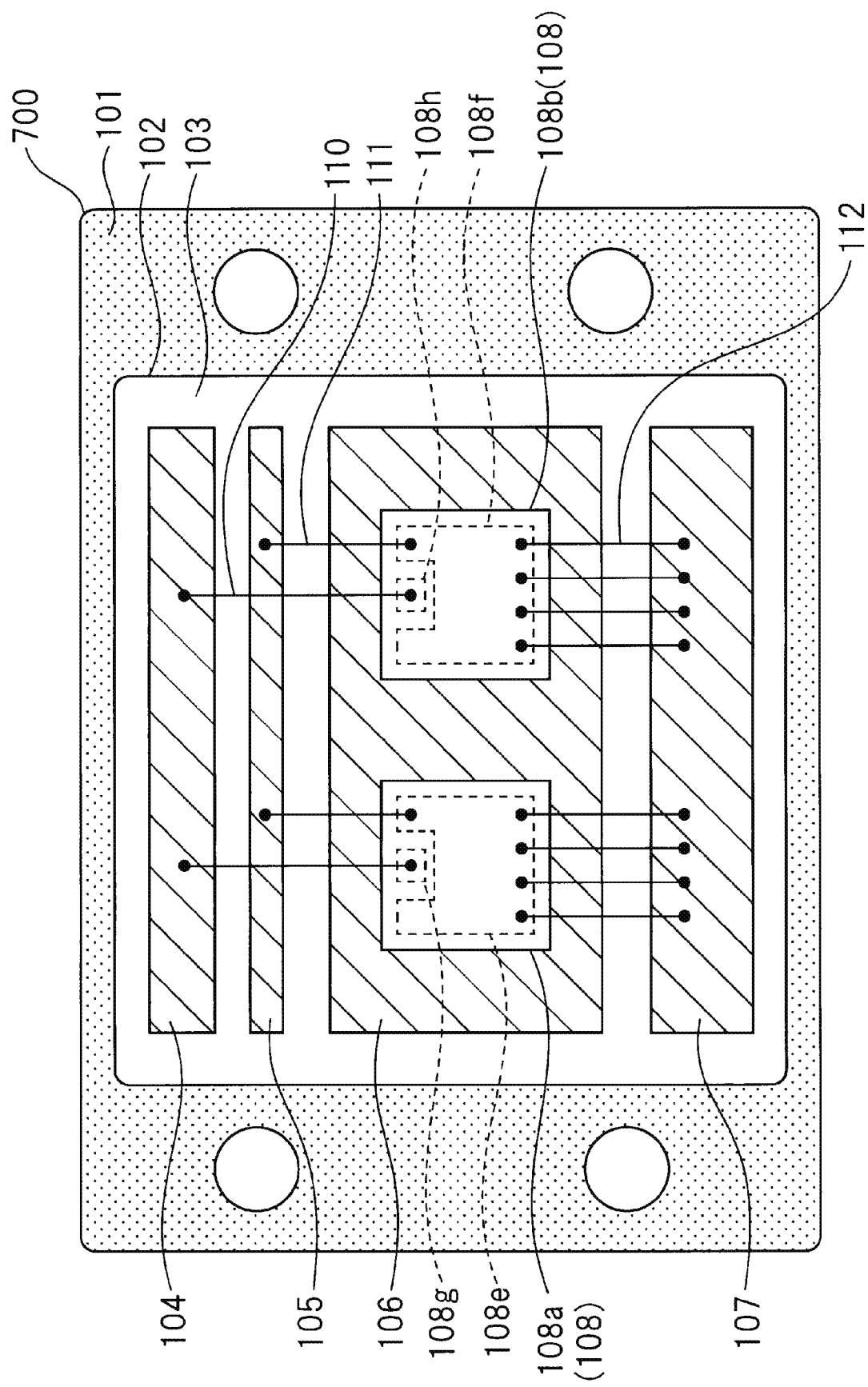
FIG. 11 is a plan view showing an example of the structure of a power module according to a third embodiment of the present inventions.
Figure 12:
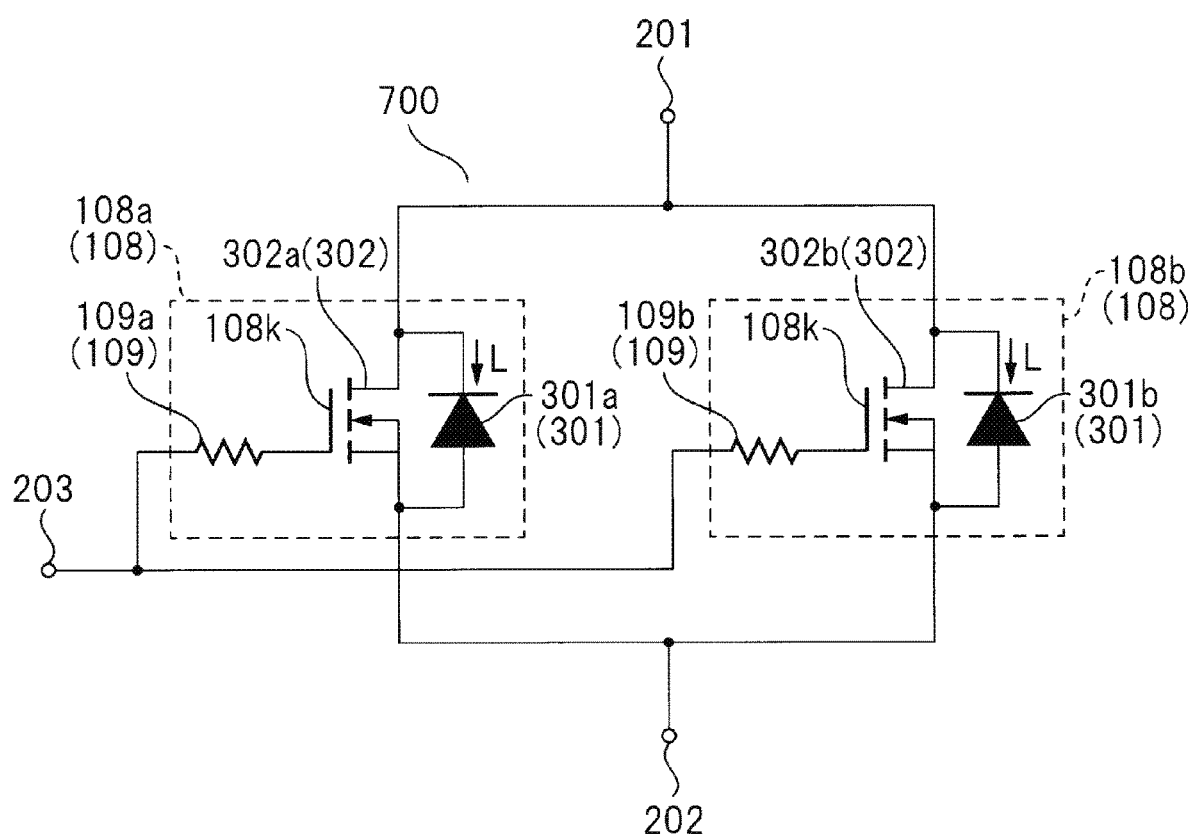
FIG. 12 is a circuit diagram of the power module shown in FIG. 11.

FIG. 11 is a plan view showing an example of the structure of a power module according to a third embodiment of the present invention. FIG. 12 is a circuit diagram of the power module shown in FIG. 11.

The third embodiment describes a case in which a gate resistance is built in a semiconductor chip which is a switching device mounted on a power module 700 shown in FIG. 11. Further, the description focuses on the case in which two semiconductor chips (switching devices) are mounted on the power module 700.

Thus, the chip resistance, which is provided as a gate resistance on the gate wiring pattern 104 of the insulating substrate 102 in the power module 100 according to the first embodiment, is not provided in the power module 700 of the third embodiment.

In other words, as shown in FIG. 12, the first body diode 301a and the first gate resistance 109a are built in the first switching device 108a, respectively. Further, the second body diode 301b and the second gate resistance 109b are built in the second switching device 108b, respectively.

Also in the power module 700, similar to the first embodiment, the resistance value is made greater in the gate resistance connected to the semiconductor chip with the smaller current value when a predetermined voltage is applied in the forward direction L of the body diode 301, than in the gate resistance connected to the semiconductor chip with the greater current value when the predetermined voltage is applied in the forward direction L of the body diode 301.

For example, when the current value is smaller in the first switching device 108a when the predetermined voltage is applied in the forward direction L of the body diode 301, the first switching device 108a selects a semiconductor chip in such a way that the resistance of the built-in gate resistance is greater than in the second switching device 108b. In other words, the semiconductor chips are selected in such a way that the resistance value of the built-in gate resistance 109 is greater in the first switching device 108a than in the second switching device 108b.

More specifically, in the chip screening process of Step S9 shown in FIG. 5, a combination of two semiconductor chips is selected in such a way that the resistance value of the built-in gate resistance 109 is greater in the semiconductor chip of the first switching device 108a than in the semiconductor chip of the second switching device 108b. Then, the two selected semiconductor chips are mounted on the insulating substrate 102 in the assembly of the power module 700.

In other words, in the first semiconductor chip and the second semiconductor chip that are selected as described above, the current value when a predetermined voltage is applied in the forward direction L of the built-in first body diode 301a is smaller in the first switching device 108a which is the first semiconductor chip, than in the second switching device 108b. At the same time, the resistance value of the built-in first gate resistance 109a is greater in the first switching device 108a than in the second switching device 108b.

By mounting the first semiconductor chip and the second semiconductor chip that are selected as described above, it is possible to increase the switching loss of the semiconductor chip with the smaller current value also in the power module 700. In this way, the temperature of the semiconductor chip with the smaller current value increases, so that the voltage in the forward direction L can be reduced. As a result, it is possible to prevent current concentration in other semiconductor chips, and to improve the current balance (current distribution) in each chip. In this way, it is possible to increase the reliability of the power module 700, and to extend the life of the power module 700.

Further, of the first and second semiconductor chips, the resistance of the MOSFET (switching device) of the semiconductor chip including the built-in gate resistance 109 with the greater resistance value can be made greater than the resistance of the MOSFET (switching device) of the semiconductor chip including the built-in gate resistance 109 with the smaller resistance value.

As described above, by adjusting the magnitude of the resistance of the MOSFETs in the first semiconductor chip and the second semiconductor chip, the temperature of the semiconductor chip with the smaller current value when the predetermined voltage is applied in the forward direction L increases. Thus, it is possible to reduce the voltage in the forward direction L.

In this way, it is possible to prevent current concentration in other semiconductor chips and to improve the current balance (current distribution) in each chip. As a result, it is possible to further increase the reliability of the power module 700 and to further extend the life of the power module 700.

The invention made by the present inventors has been concretely described based on exemplary embodiments. However, the present invention is not limited to the above exemplary embodiments but includes various modifications and variations. For example, the above exemplary embodiments have been described in detail to better illustrate the present invention, and are not necessarily limited to those having all configurations described in the exemplary embodiments.

Further, part of the configuration of an embodiment can be replaced by the configuration of other embodiments, and the configuration of an embodiment can be added to the configuration of other embodiments. Further, addition, deletion, and replacement of other configurations can be made with respect to part of the configuration of each embodiment. Note that the members and relative sizes shown in figures are simplified and idealized to make the present invention easy to understand, which have however a more complicated shape in the implementation.

For example, the first and second embodiments have described a case in which chip resistances with different resistance values are used as a means of adjusting the resistance value in such a way that the gate resistance, which is connected to the semiconductor chip with the smaller current value when a predetermined voltage is applied in the forward direction L of the body diode, is made greater than the gate resistance connected to the semiconductor chip with the larger current value. However, it is also possible to establish a magnitude relationship of the gate resistance by means other than the chip resistance.

For example, in a plurality of semiconductor chips, it is also possible to establish a magnitude relationship of the gate resistance by changing the thickness (diameter), shape, material, or number of conductive wires that electrically connect between the gate pad of the semiconductor chip and the gate wiring pattern of the insulating substrate.

Further, each semiconductor chip is not limited to that of SiC, but may be comprised of Si (silicon).

Further, the above embodiments have focused on semiconductor chips with MOSFETs as an example. However, it is also possible that semiconductor chips have transistors other than MOSFETs.

What is claimed is:

1. A power module comprising:
   a plurality of semiconductor chips each including a diode and a transistor that are electrically connected to each other, the semiconductor chips being electrically connected in parallel; and
   a substrate on which the semiconductor chips are mounted,
   wherein a gate electrode of the transistor that each of the semiconductor chips has is electrically connected to a gate resistance,
   wherein, in any two of the semiconductor chips, the gate resistance electrically connected to the semiconductor chip whose current value is smaller when a predetermined voltage is applied in the forward direction of the diode, is greater than the gate resistance electrically connected to the semiconductor chip whose current value is larger when the predetermined voltage is applied in the forward direction of the diode,
   wherein the gate resistance is built in each of the semiconductor chips,
   wherein each of the semiconductor chips has a MOSFET with an epitaxial layer, and
   wherein, of the semiconductor chips, the resistance of the MOSFET that the semiconductor chip including the gate resistance with the greater resistance value has is greater than the resistance of the MOSFET that the semiconductor chip including the gate resistance with the smaller resistance value has.

2. The power module according to claim 1, wherein each of the semiconductor chips is comprised of silicon carbide.

3. A power module comprising:
   first and second semiconductor chips each including a diode and a transistor that are electrically connected to each other, the first and second semiconductor chips being electrically connected in parallel; and
   a substrate on which the first and second semiconductor chips are mounted,
   wherein a gate electrode of the transistor that each of the first and second semiconductor chips has is electrically connected to a gate resistance,
   wherein, of the first and second semiconductor chips, the gate resistance that is electrically connected to the semiconductor chip whose current value is smaller when a predetermined voltage is applied in the forward direction of the diode, is greater than the gate resistance that is electrically connected to the semiconductor chip whose current value is larger when the predetermined voltage is applied in the forward direction of the diode,
   wherein the gate resistance is built in each of the first and second semiconductor chips,
   wherein each of the first and second semiconductor chips has a MOSFET with an epitaxial layer, and
   wherein, of the first and second semiconductor chips, the resistance of the MOSFET that the semiconductor chip including the gate resistance with the greater resistance value has is greater than the resistance of the MOSFET that the semiconductor chip including the gate resistance with the smaller resistance value has.

4. The power module according to claim 3, wherein each of the first and second semiconductor chips is comprised of silicon carbide.

5. A power converter comprising:
   a first line;
   a second line whose potential is lower than that of the first line;
   a high-side transistor unit provided between the first line and the second line, the high-side transistor unit being electrically connected to the first and second lines; and
   a low-side transistor unit provided between the first line and the second line, the low-side transistor unit being electrically connected to the first and second lines and also electrically connected in series to the high-side transistor unit,
   wherein a plurality of transistors are electrically connected in parallel to each of the high-side transistor unit and the low-side transistor unit, each of the transistors being electrically connected to a diode, in which the gate electrode of each of the transistors is electrically connected to a gate resistance, and
   wherein in each of the high-side transistor unit and the low-side transistor unit, the gate resistance that is electrically connected to a transistor whose current value is smaller when a predetermined voltage is applied in the forward direction of the diode, is greater than the gate resistance that is electrically connected to a transistor whose current value is larger when the predetermined voltage is applied in the forward direction of the diode.

* * * * *